US005593742A

United States Patent [19]
Lux et al.

[11] Patent Number: 5,593,742
[45] Date of Patent: Jan. 14, 1997

[54] FABRICATION OF SILICON MICROCLUSTERS AND MICROFILAMENTS

[75] Inventors: Robert A. Lux, Toms River, N.J.; James A. Harvey, Apex, N.C.; Arthur Tauber, Elberon; Steven C. Tidrow, Eatontown, both of N.J.

[73] Assignee: The United States of America as represented by the Secretary of the Army, Washington, D.C.

[21] Appl. No.: 518,770

[22] Filed: Aug. 24, 1995

[51] Int. Cl.⁶ .......................... C23C 8/00; C23C 14/30; H05B 7/00
[52] U.S. Cl. .................. 427/586; 427/561; 427/583; 427/596
[58] Field of Search ................ 427/56, 567, 568, 427/583, 585, 586, 596, 597; 219/121.65, 121.66, 121.85

[56] References Cited

U.S. PATENT DOCUMENTS

| | | | |
|---|---|---|---|
| 4,629,859 | 12/1986 | Reddy | 427/568 |
| 4,892,751 | 1/1990 | Miyake et al. | 427/586 |
| 4,959,242 | 9/1990 | Itoh | 427/585 |
| 5,096,739 | 3/1992 | Strutt et al. | 427/584 |
| 5,103,284 | 4/1992 | Ovshinsky et al. | 357/60 |
| 5,254,832 | 10/1993 | Gartner et al. | 427/561 |

*Primary Examiner*—Marianne Padgett
*Attorney, Agent, or Firm*—Michael Zelenka; John M. O'Meara

[57] ABSTRACT

An ablation process by which fused deposits of silicon particles are accumulated on a substrate of selected material in accordance with whether microclusters of spherical configurations or microfilaments of cylindrical configurations are to be fabricated. Silicon ablation is accomplished in an inert gas atmosphere with an excimer laser that generates light pulses of which the wavelength and frequency are controlled to fix the energy level thereof. The pressure of the inert gas atmosphere is also controlled in accordance with whether microclusters or microfilaments are to be fabricated.

10 Claims, 1 Drawing Sheet

FABRICATION OF SILICON MICROCLUSTERS AND MICROFILAMENTS

GOVERNMENT INTEREST

The invention described herein may be manufactured, used, and licensed by or for the United States Government for governmental purposes without payment to us of any royalties thereon.

FIELD OF INVENTION

This invention relates to a process for accumulating very small particles of silicon into spherical clusters (hereinafter microclusters) and thin strands or filaments (hereinafter microfilaments).

BACKGROUND OF THE INVENTION

Silicon microclusters and microfilaments have many applications which include electroluminescent display films, light-emitting diodes, resonant tunneling devices, single electronic devices, detection and analysis devices for chemical and biological agents, sintering of silicon wafers or chips, fabricating films of silicon compounds such as silicon carbide, and in the fabrication of ceramic devices. The fabrication of silicon microclusters has been accomplished by electrochemical etching of p-type silicon wafers, as described by L. T. Canham, Applied Physics Letters, 57, 1046 (1990).

Laser ablation and deposition of fine particles of some materials are known to the art, such as alumina which is described by G. P. Johnson et al. in J. Am. Ceram. Soc., 75(12), 3293–3298(1992) and ibid, 75(12), 3265–3268(1992).

SUMMARY OF THE INVENTION

Using laser ablation in an inert gas environment or atmosphere, particles are transferred from a block of silicon to an appropriate substrate on which they fuse into microcluster or microfilament deposits. A gold film on quartz is utilized as the substrate when fabricating microclusters, while oscillator-quality quartz is utilized as the substrate when fabricating microfilaments. A narrow particle size distribution results in the fused deposits and the surface and/or homogeneous chemical characteristics thereof are controllable, as is the overall size thereof.

DETAILED DESCRIPTION OF THE INVENTION

Figure 1:
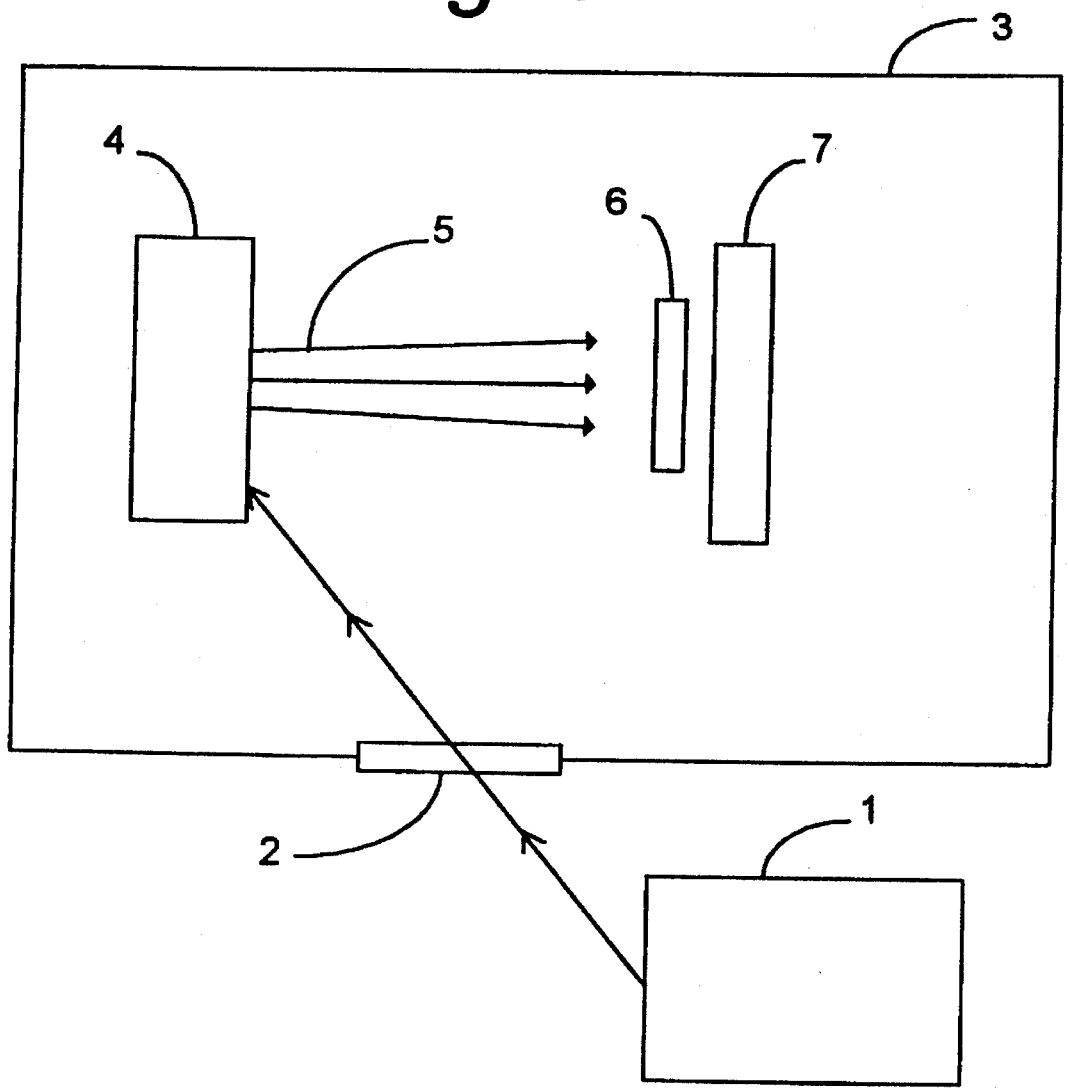
FIG. 1 is a block diagram representation of apparatus used in carrying out the process of this invention.

As illustrated in FIG. 1, the process of the invention is accomplished with an ablation system having an excimer laser 1 which emits high energy light pulses that travel through a quartz window 2 in the wall of a vacuum chamber 3 and strike a target area on a silicon block 4. A plasma of particles 5 depart from the block 4 and transfer to a substrate 6 on which they fuse together as porous deposits in an inert gas atmosphere, such as argon that is sustained at a pressure by a control means 7. The temperature of substrate 6 may be elevated by a heater (not shown) but room temperature is to be assumed throughout this disclosure. Block 4 is a single crystal silicon wafer and is separated from the substrate 6 by approximately 5 cm. The chemical composition of silicon block 4 need not be pure and the homogeneous characteristics thereof, will be maintained in the fused deposits which result when the process of this invention is utilized. Also, the surface chemistry of the fused deposits may be controlled by either incorporating dopants with the block 4 or adding chemically active gases, such as hydrogen and oxygen to the inert gas atmosphere.

Preferably, the laser operates on krypton fluoride (KrF) gas, such as a Questek model 2640 excimer laser. However, a laser which operates on argon fluoride (ArF) gas could be utilized. Relative to the disclosure hereinafter, laser 1 generates light pulses having a wavelength of 248 nanometers and a pulse width of 20 nanoseconds, while the laser fluence or pulse energy per unit target area, is 150 mJ/mm$^2$. For these laser parameters, the diameter of particles 5 ranges from 10 to 20 Angstrom units, depending on the frequency at which the laser pulses occur. However, the invention is not limited to these laser parameters.

When microclusters are fabricated, the substrate 6 is a gold film of approximately 1000 Angstrom thickness, such as can be sputtered on a quartz base. Argon gas pressure in the range of 20 to 200 mTorr is utilized, along with a laser pulse frequency in the range of 25 to 35 Hz. The microclusters have a spherical configuration that ranges in diameter from 200 to 1000 Angstrom units.

When microfilaments are fabricated, the substrate 6 is oscillator-quality quartz. Argon gas pressure in the range of 0.05 to 0.5 Atmospheres is utilized, along with a laser pulse frequency in the range of 5 to 15 Hz. The microfilaments have a cylindrical configuration that ranges in diameter from 1000 Angstrom units to 1 micron and in length up to several microns.

In accordance with particular embodiments of this invention, microclusters and microfilaments are fabricated in a deposition time of 12 minutes. For the microclusters, an argon pressure of 150 mTorr is utilized along with a laser pulse frequency of 30 Hz. For the microfilaments, an argon gas pressure of 0.2 Atmospheres is utilized along with a laser pulse frequency of 10 Hz.

Those skilled in the art will appreciate without any further explanation that within the concept of this invention, many modifications and variations are possible to the above disclosed ablation process embodiments. Consequently, it should be understood that all such modifications and variations fall within the scope of the following claims.

What we claim is:

1. An ablation process for fabricating porous silicon microclusters comprising:

using laser light pulses in an inert atmosphere of argon gas pressurized in a range of 20–200 mTorr to derive a plasma of particles which have a surface chemistry and extend along a path from a block of silicon material, with the laser light pulses having a wavelength of 248 nanometers, a frequency ranging from 25 to 35 Hz and a laser fluence of 150 mJ/mm$^2$;

locating a substrate having a gold film on a quartz base, in the path of the particles; and accumulating fused deposits of the particles on the substrate, with the particles having spherical configurations ranging in diameter from 200 to 1000 Angstrom units.

2. The process of claim 1 wherein at least one dopant is incorporated with the silicon block to control the surface chemistry of the fused deposits.

3. The process of claim 1 wherein at least one chemically active gas is included with the argon gas to control the surface chemistry of the fused deposits.

4. The process of claim 1 wherein the argon gas is pressurized at 150 mTorr, while the frequency of the light pulses is 30 Hz and the fused deposits of spherical configurations are accumulated in a deposition time of 12 minutes.

5. An ablation process for fabricating porous silicon microfilaments, comprising:

using laser light pulses in an inert atmosphere of argon gas pressurized in a range of 0.05–0.5 Atmospheres to derive a plasma of particles which have a surface chemistry and extend along a path from a block of silicon material, with the laser light pulses having a wavelength of 248 nanometers, a frequency ranging from 5 to 15 Hz and a laser fluence of 150 mJ/mm$^2$;

locating a substrate of oscillator-quality quartz in the path of the particles; and accumulating fused deposits of cylindrical configurations ranging in diameter from 1000 Angstrom units to 1 micron and in length up to several microns.

6. The process of claim 5 wherein the argon gas is pressurized at 0.2 Atmospheres, while the frequency of the light pulses is 10 Hz and the fused deposits of cylindrical configurations are accumulated in a deposition time of 12 minutes.

7. The process of claim 5 wherein at least one dopant is incorporated with the silicon block to control the surface chemistry of the fused deposits.

8. The process of claim 5 wherein at least one chemically active gas is included with the argon gas to control the surface chemistry of the fused deposits.

9. The process of claim 6 wherein at least one dopant is incorporated with the silicon block to control the surface chemistry of the fused deposits.

10. The process of claim 6 wherein at least one chemically active gas is included with the argon gas to control the surface chemistry of the fused deposits.

* * * * *